United States Patent
Zhu et al.

(10) Patent No.: US 10,411,027 B2
(45) Date of Patent: Sep. 10, 2019

(54) INTEGRATED CIRCUITS WITH MEMORY CELLS AND METHOD FOR PRODUCING THE SAME

(71) Applicant: Globalfoundries Singapore Pte. Ltd., Singapore (SG)

(72) Inventors: Ming Zhu, Singapore (SG); Pinghui Li, Singapore (SG); Eng Huat Toh, Singapore (SG); Yiang Aun Nga, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/787,764

(22) Filed: Oct. 19, 2017

(65) Prior Publication Data

US 2019/0123059 A1    Apr. 25, 2019

(51) Int. Cl.
*H01L 29/78* (2006.01)
*H01L 29/66* (2006.01)
(Continued)

(52) U.S. Cl.
CPC .. *H01L 27/11568* (2013.01); *H01L 27/11573* (2013.01); *H01L 29/42344* (2013.01); *H01L 29/7851* (2013.01)

(58) Field of Classification Search
CPC ......... H01L 27/11517; H01L 27/11524; H01L 27/11529; H01L 27/11531; H01L 27/11536; H01L 27/11558; H01L 27/11539; H01L 27/11568; H01L 27/1157; H01L 27/11573; H01L 27/1211; H01L 29/28282; H01L 29/42328; H01L 29/66833; H01L 29/792–7926; H01L 2924/1434; H01L 2924/1435; H01L 2924/1436; H01L 2924/14361; H01L 2924/14368; H01L 2027/11866; H01L 2027/11868; H01L 2027/11875;
(Continued)

(56) References Cited

U.S. PATENT DOCUMENTS 5,968,383 A    10/1999   Yamazaki et al.
7,589,387 B2    9/2009   Hwang et al.
(Continued)

OTHER PUBLICATIONS

Tsuda et al., "First Demonstration of FinFET Split-Gate MONOS for High-Speed and Highly-Reliable Embedded Flash in 16/14nm-node and beyond", in 2016 IEEE International Electron Devices Meeting (IEDM), 2016, p. 280-283.

*Primary Examiner* — Natalia A Gondarenko
(74) *Attorney, Agent, or Firm* — Lorenz & Kopf, LLP

(57) ABSTRACT

Integrated circuits and methods of producing the same are provided. In an exemplary embodiment, an integrated circuit includes a substrate and a fin extending from the substrate. The fin includes a first and second fin sidewall, and a memory cell layer is adjacent to the first and second fin sidewalls. A first control gate is adjacent to the memory cell layer where the memory cell layer is between the first fin sidewall and the first control gate. A second control gate is also adjacent to the memory cell layer, where the memory cell layer is between the second fin sidewall and the second control gate. The first and second control gates are electrically isolated from each other.

19 Claims, 8 Drawing Sheets

(51) Int. Cl.
*H01L 29/792* (2006.01)
*H01L 27/1157* (2017.01)
*H01L 21/336* (2006.01)
*H01L 21/762* (2006.01)
*H01L 21/8234* (2006.01)
*H01L 27/11568* (2017.01)
*H01L 29/423* (2006.01)
*H01L 27/11573* (2017.01)

(58) Field of Classification Search
CPC ....... H01L 2027/11885; H01L 29/7851; H01L 29/66484; H01L 29/42344; H01L 29/42392; H01L 29/788; H01L 29/0642; H01L 29/6681; H01L 29/66818; H01L 29/66871; H01L 29/41791; H01L 29/4175; H01L 29/42312; H01L 29/0649; H01L 29/7831; H01L 21/302; H01L 21/304; H01L 21/30625; H01L 21/3212; H01L 21/32125; H01L 21/461; H01L 21/76224; H01L 21/76281; H01L 21/76283; H01L 21/76205; H01L 2224/03602; H01L 2224/03616; H01L 2224/03845; H01L 2224/11602; H01L 2224/11616; H01L 2224/11845; H01L 2224/27602; H01L 2224/27616; H01L 2027/11829; H01L 2027/11831; H01L 29/785; H01L 29/7855; H01L 29/7856; H01L 29/7858; H01L 21/823481; H01L 21/823821; H01L 21/823828; H01L 21/82385; H01L 21/823857; H01L 21/823864; H01L 21/823878; H01L 21/8239

USPC ....... 257/326, 315, 316, 318, 319, 320, 324, 257/314, 321; 438/257

See application file for complete search history.

(56) References Cited

U.S. PATENT DOCUMENTS

| | | | |
|---|---|---|---|
| 8,093,631 B2* | 1/2012 | Jeong | H01L 27/105 257/239 |
| 2004/0251487 A1* | 12/2004 | Wu | H01L 27/115 257/315 |
| 2005/0227435 A1* | 10/2005 | Oh | B82Y 10/00 438/257 |
| 2006/0249779 A1* | 11/2006 | Choi | H01L 27/115 257/315 |
| 2007/0176223 A1* | 8/2007 | Chindalore | B82Y 10/00 257/314 |
| 2008/0067572 A1* | 3/2008 | Mokhlesi | H01L 27/115 257/315 |
| 2010/0283098 A1* | 11/2010 | Yoshida | H01L 27/11568 257/324 |

* cited by examiner

INTEGRATED CIRCUITS WITH MEMORY CELLS AND METHOD FOR PRODUCING THE SAME

TECHNICAL FIELD

The technical field generally relates to integrated circuits with memory cells and methods of producing the same, and more particularly relates to integrated circuits with two-bit memory cells formed on fin sidewalls, and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Some semiconductor devices include fins and finned field effect transistors (FinFETs). Manufacturing costs can be reduced by forming memory cells with fins when FinFETs are utilized, so the finned structure is common to the memory cells and the FinFETs. Traditionally, the memory cells are formed in a memory bank area of the integrated circuit, and FinFETs are formed in a logic area of the integrated circuit. However, traditional floating gate memory cells formed over the fin may fill most of the space between adjacent fins such that the remaining space between adjacent floating gates has a high aspect ratio. The high aspect ratios can lead to undesirable gaps formed in a control gate that is formed between adjacent floating gates, especially when the fins are spaced close together.

It is desirable to form memory cells on fins where the height of each memory cell is about the same as the height of FinFETs formed in a logic portion of the integrated circuit. The traditional floating gate tends to produce a taller structure for the memory cells than for the FinFETs. The different heights require additional masks and separate processing, which tends to increase production costs. In addition to the gate height issues, total memory capacity can be increased by utilizing two-bit memory cells as opposed to one-bit memory cells.

Accordingly, it is desirable to provide integrated circuits with finned memory cells where a control gate formed between adjacent fins has no gaps. In addition, it is desirable to provide integrated circuits with two-bit finned memory cells having a height that extends only a short distance over the fins. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a substrate and a fin extending from the substrate. The fin includes first and second fin sidewalls, and a memory cell layer is adjacent to the first and second fin sidewalls. A first control gate is adjacent to the memory cell layer such that the memory cell layer is between the first fin sidewall and the first control gate. A second control gate is also adjacent to the memory cell layer such that the memory cell layer is between the second fin sidewall and the second control gate. The first and second control gates are electrically isolated from each other.

An integrated circuit is provided in another embodiment. The integrated circuit includes a substrate and a fin extending from the substrate. A memory cell layer overlies the fin. The integrated circuit includes a first memory cell that includes the fin and the memory cell layer. The integrated circuit also includes a second memory cell separate from the first, where the second memory cell includes the same fin as the first memory cell, and the second memory cell includes the same memory cell layer as the first memory cell. The memory cell layer is continuous from the first memory cell to the second memory cell.

A method of producing an integrated circuit is provided in yet another embodiment. The method includes forming a memory cell layer overlying a fin that extends from a substrate. The memory cell layer is also formed adjacent to first and a second fin sidewalls. A first control gate is formed adjacent to the memory cell layer such that the memory cell layer is between the first fin sidewall and the first control gate. A second control gate is formed adjacent to the memory cell layer such that the memory cell layer is between the second fin sidewall and the second control gate, where the first and second control gates are electrically isolated from each other.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details. In exemplary embodiments described herein, a two-bit memory cell is formed along a fin, where one bit is formed on each side of the fin. Control gates are formed between adjacent fins, where the control gates on opposite sides of a fin are electrically isolated from each other.

Figure 1:
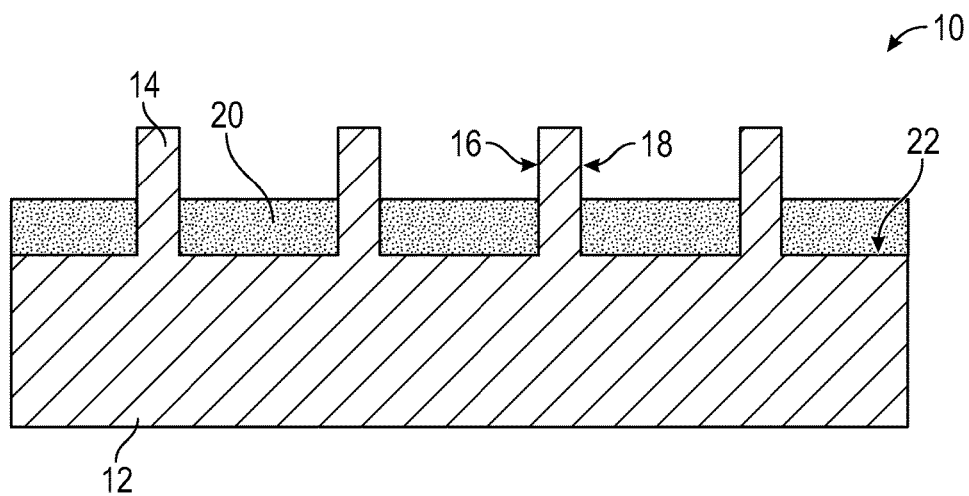
FIGS. 1-9 are cross sectional views along line A-A of FIG. 12 that illustrate an integrated circuit and methods of producing the same in accordance with exemplary embodiments.

Reference is made to an exemplary embodiment illustrated in FIG. 1. An integrated circuit 10 includes a substrate 12, where the substrate 12 includes a semiconductor material. As referred to herein, a material that "includes" a recited element/compound includes the recited element/compound in an amount of at least 10 weight percent or more based on the total weight of the material unless otherwise indicated. As used herein, the term "semiconductor material" will be used to encompass semiconductor materials conventionally used in the semiconductor industry to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. As used herein, a component "primarily" includes a material if that material is more than about 50 weight percent of the component. The substrate 12 may be a bulk silicon wafer (as illustrated) or may be a thin layer of semiconductor, such as silicon, on an insulating layer (commonly known as semiconductor- or silicon-on-insulator or SOI, not illustrated) that, in turn, is supported by a carrier wafer.

Fins 14 extend from the substrate 12, where the fins 14 include semiconductive material that may be the same material as that of the substrate 12 in some embodiments. The fins 14 have a first fin sidewall 16 opposite a second fin sidewall 18. A fin insulator 20 overlies the substrate 12 between adjacent fins 14, where a portion of the fin 14 extends above the fin insulator 20. As used herein, the term "overlying" means "over" such that an intervening layer may lie between the overlying component (the fin insulator 20 in this example) and the underlying component (the substrate 12 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, so reference to a "vertical" line means a line that is about perpendicular to a substrate surface 22. Generally, the integrated circuit 10 can be operated in any orientation. Spatially relative terms, such as "top", "bottom", "over" and "under" are made in the context of the orientation of the cross-sectional figures (including FIG. 1). It will be understood that the spatially relative terms are intended to encompass different orientations of the device in use or operation in addition to the orientation depicted in the figures. Thus, the exemplary terms "over" and "under" can each encompass either an orientation of above or below depending upon the orientation of the device. The device may be otherwise oriented (e.g., rotated 90 degrees or at other orientations) and the spatially relative descriptors used herein may likewise be interpreted accordingly.

The fin insulator 20 is an electrically insulating material, such as silicon dioxide, but other electrically insulating materials may be utilized in alternate embodiments. As used herein, an "electrically insulating material" or an "electrical insulator" is a material with a resistivity of about $1\times10^4$ ohm meters or more, an "electrically conductive material" or an "electrical conductor" is a material with a resistivity of about $1\times10^{-4}$ ohm meters or less, and an "electrically semiconductive material" or an "electrical semiconductor" is a material with a resistivity of from about more than $1\times10^{-4}$ ohm meters to less than about $1\times10^4$ ohm meters. The fins 14 illustrated in FIG. 1 are in a memory bank area of the integrated circuit 10. The integrated circuit 10 may include a logic area that is not illustrated herein. The memory bank area may include additional features that are not illustrated herein, such as shallow trench isolation structures or other structures in some embodiments.

Figure 2:
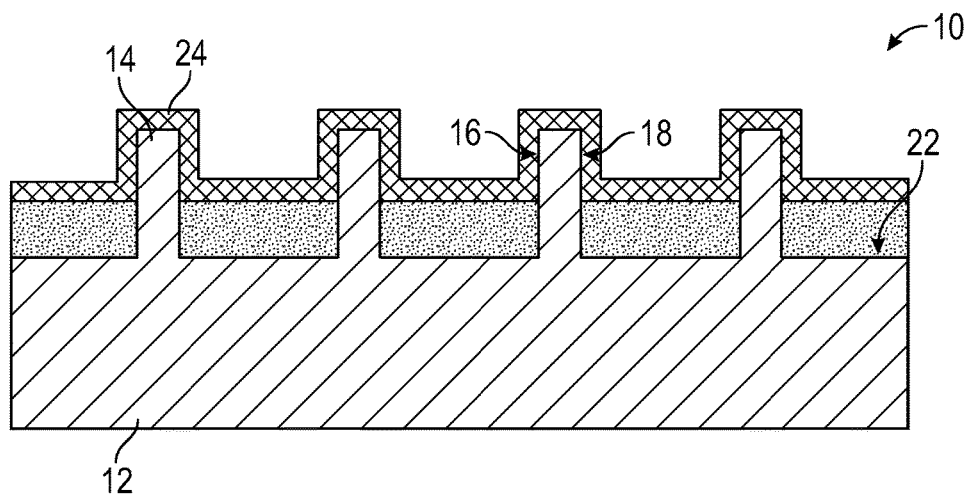
Figure 3:
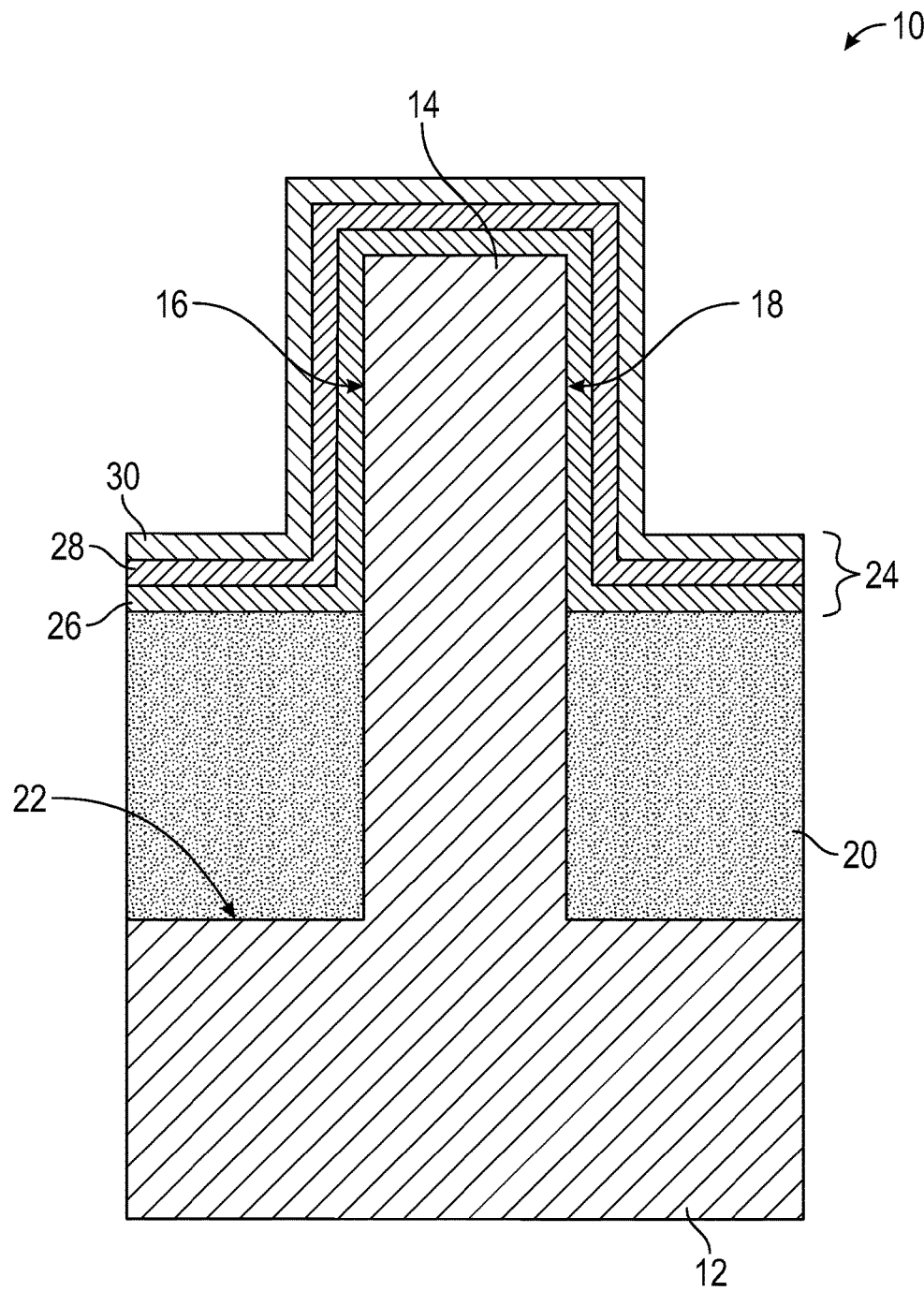

A memory cell layer 24 is formed overlying the fins 14 and the fin insulator 20, as illustrated in an exemplary embodiment in FIG. 2. The memory cell layer 24 includes at least 3 layers in an exemplary embodiment, as illustrated in FIG. 3 with continuing reference to FIG. 2, where FIG. 3 is an enlarged view of one of the fins 14 and the memory cell layer 24. In the illustrated embodiment, the memory cell layer 24 includes a base insulator layer 26 overlying a top of the fin 14 and adjacent to the first and second fin sidewalls 16, 18. In an exemplary embodiment, the base insulator layer 26 directly contacts the first and second fin sidewalls 16, 18, but an intervening layer may be present in some embodiments. An electron trap layer 28 overlies the base insulator layer 26, so the base insulator layer 26 is between the fin 14 (including the first and second fin sidewalls 16, 18) and the electron trap layer 28. A cover insulator layer 30 is then formed overlying the electron trap layer 28, so the electron trap layer 28 is between the fin 14 (including the first and second fin sidewalls 16, 18) and the cover insulator layer 30. In one embodiment, each of the base insulator layer 26, the electron trap layer 28, and the cover insulator layer 30 are electrical insulators. For example, the base insulator layer 26 and the cover insulator layer 30 may include silicon dioxide, and the electron trap layer 28 may include silicon nitride. However, other materials are utilized in alternate embodiments, such as high K dielectric materials for one or both of the base insulator layer 26 and the cover insulator layer 30. This type of memory cell layer 24 is sometimes referred to as an ONO layer. The silicon dioxide may be deposited by chemical vapor deposition using silane and oxygen, and the silicon nitride may be deposited by low pressure chemical vapor deposition using ammonia and dichlorosilane, but other deposition techniques or materials may be utilized in alternate embodiments.

The memory cell layer 24 may be from about 1 to about 10 nanometers (nm) thick in an exemplary embodiment, so the memory cell layer 24 leaves space between adjacent fins 14, even with a fin spacing of from about 20 to about 40 nanometers. The space between the fins 14 and memory cell layer 24 results in an aspect ratio (i.e., the height divided by the width of the space between adjacent fins 14) that is small enough that material without gaps can be deposited between the fins 14 even after the memory cell layer 24 is formed. The ONO memory cell layer 24 is an electrical insulator, so in operation electrons that tunnel through the cover insulator layer 30 remain trapped in the underlying electron trap layer 28. The electron trap layer 28 is an electrical insulator, so the charge in the electron trap layer 28 remains in a fixed position. As such, a charge deposited in the electron trap layer 28 adjacent to the first fin sidewall 16 does not travel significantly. Therefore, no charge is transferred from the electron trap layer 28 adjacent to the first fin sidewall 16 to the second fin sidewall 18, or vice versa, even in embodiments where the memory cell layer 24 is continuous between the first and second fin sidewalls 16, 18. The insulating nature of the memory cell layer 24 facilitates operations of separate memory cells on opposite sides of a single fin 14, even when the memory cell layer 24 is continuous over the fin 14, as described more fully below.

Figure 4:
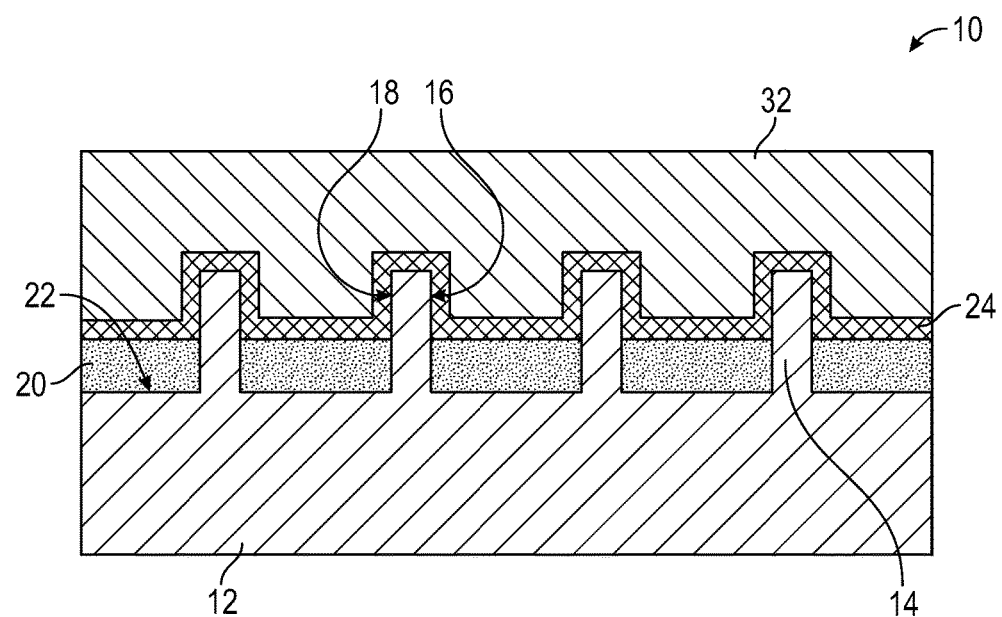

FIG. 4 illustrates an embodiment with a control gate layer 32 formed overlying the fins 14, the memory cell layer 24, and the fin insulator 20. The control gate layer 32 is an electrical conductor, and includes polysilicon with conductivity determining impurities at a sufficient concentration to make the control gate layer 32 an electrical conductor. Conductivity determining impurities, sometimes referred to as "dopants," are generally classified as either "P" or "N" type. "P" type conductivity determining impurities typically include boron, aluminum, gallium, and indium, but other materials could also be used. "N" type conductivity determining impurities typically include phosphorous, arsenic, and/or antimony, but other materials could also be used.

Figure 5:
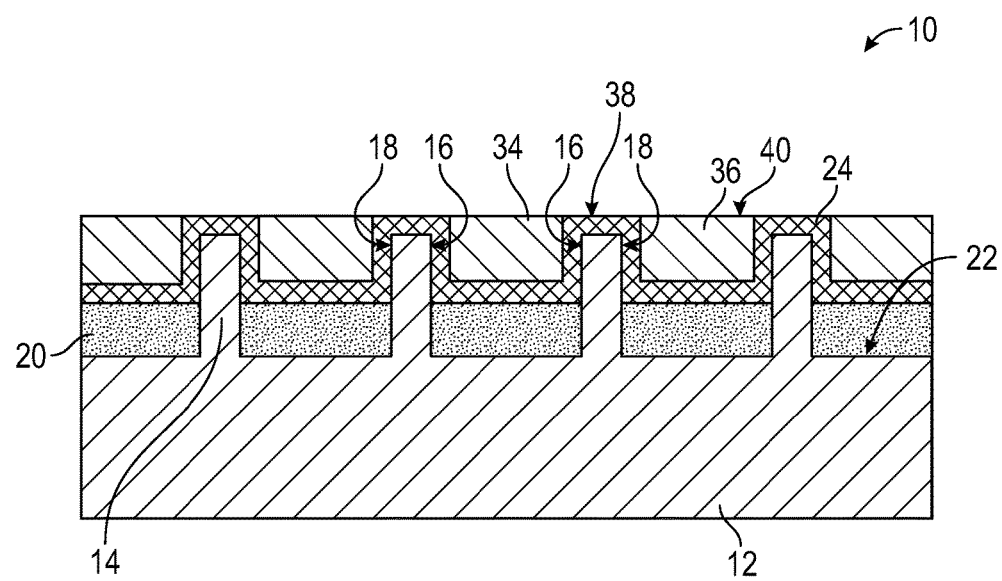

The control gate layer 32 is reduced in height to form a first control gate 34 and a second control gate 36, as illustrated in FIG. 5 with continuing reference to FIG. 4. The control gate layer 32 may be reduced in height by chemical mechanical planarization (CMP), and the uppermost layer of the memory cell layer 24 is used as a CMP stop in some embodiments. As such, a memory cell layer top surface 38, which directly overlies the fin 14, and a control gate top surface 40 are co-planar. The height of the control gate top surface 40 is the same for the first and second control gates 34, 36, and the first and second control gates 34, 36 are separated and electrically isolated from one another by the fin 14 and the memory cell layer 24. The first control gate 34 is positioned between adjacent fins 14, and each fin sidewall contacting the first control gate 34 is a first fin sidewall 16. As such, the first fin sidewall 16 alternates between being on the left or right of each adjacent fin 14. In other words, the first control gate 34 is positioned between the first fin sidewall 16 of one fin 14 and the first fin sidewall 16 of the adjacent fin 14. The control gate layer 32 may be formed overlying the memory cell layer 24, so the first and second control gates 34, 36 overlie the memory cell layer 24 in some embodiments. As such, the memory cell layer 24 may be positioned between the first control gate 34 and the underlying fin insulator 20, and another portion of the memory cell layer 24 may be positioned between the second control gate 36 and another fin insulator 20.

Figure 6:
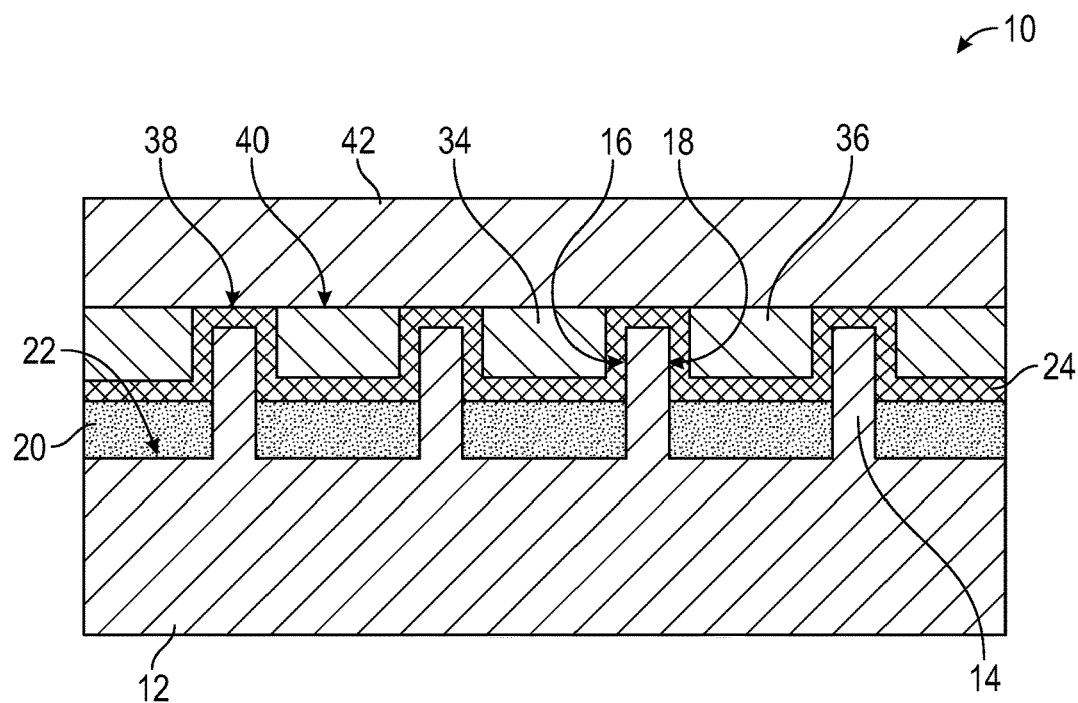

Reference is made to an exemplary embodiment illustrated in FIG. 6. A first interlayer dielectric 42 is formed overlying the fins 14, the memory cell layer 24, and the first and second control gates 34, 36. The first interlayer dielectric 42 is an electrical insulator, and may include a wide variety of electrically insulating materials in various embodiments. For example, un-doped silicate glass (USG), silicon nitride, silicon oxynitride, silicon dioxide, low K dielectric materials, or combinations thereof may be used. In an exemplary embodiment, the first interlayer dielectric 42 includes silicon dioxide, which may be deposited by chemical vapor deposition using silane and oxygen, but other techniques and/or materials are utilized in alternate embodiments.

Figure 7:
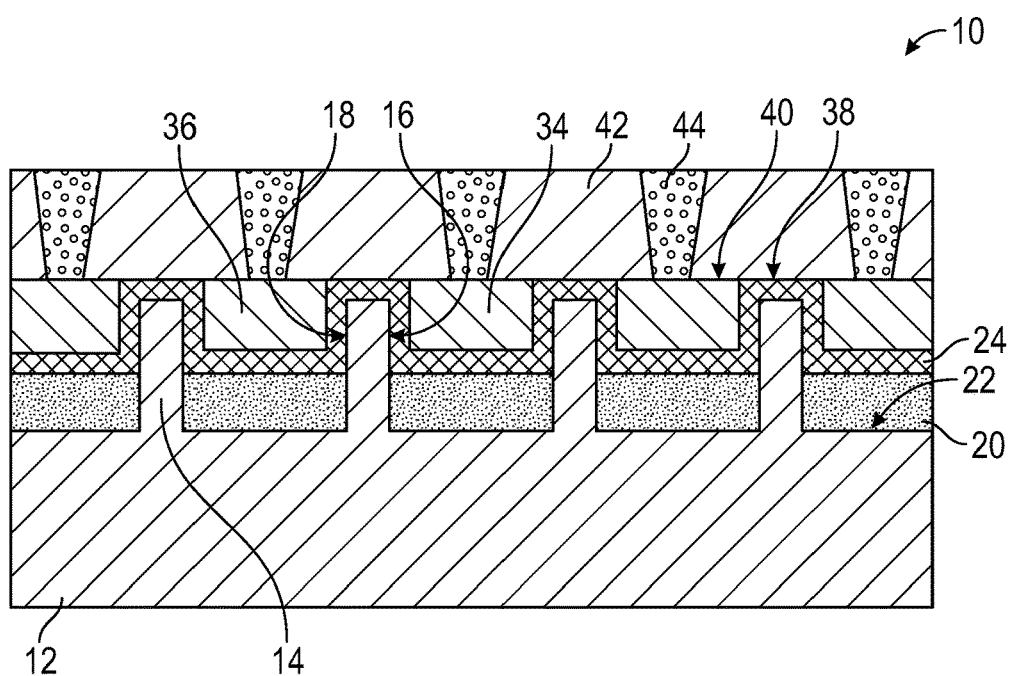

Referring to an embodiment in FIG. 7, a plurality of via contacts 44 are formed in the first interlayer dielectric 42. A via (not illustrated) may be formed by selectively etching through the first interlayer dielectric layer 42 at desired locations, where the desired locations are positioned lithographically. A reactive ion etch with carbon tetrachloride may be used to form the via, but other etchants or etch techniques may be utilized in alternate embodiments. The via contact 44 is an electrical conductor, and includes tungsten, copper, aluminum, or other electrically conductive materials in various embodiments. In an exemplary embodiment, the via contacts 44 include an adhesion layer, a barrier layer, and a plug (not individually illustrated), which are sequentially deposited. In one exemplary embodiment, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other conductive materials may be utilized in the via contact 44 in alternate embodiments, and the material in the via contact 44 may vary within one integrated circuit 10, such as in different interlayer dielectric layers.

Figure 8:
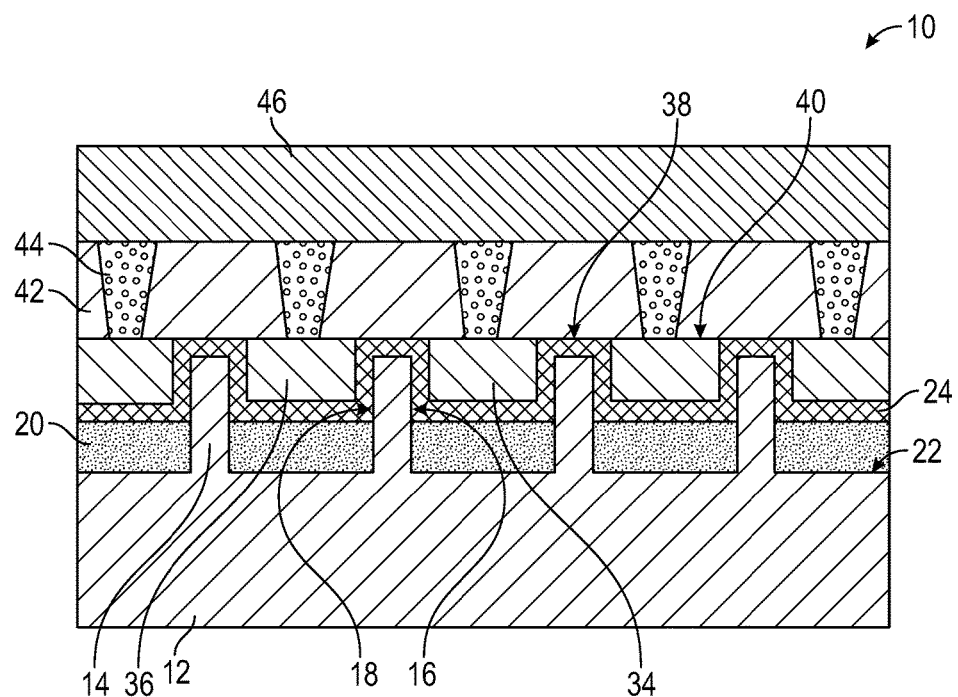
Figure 9:
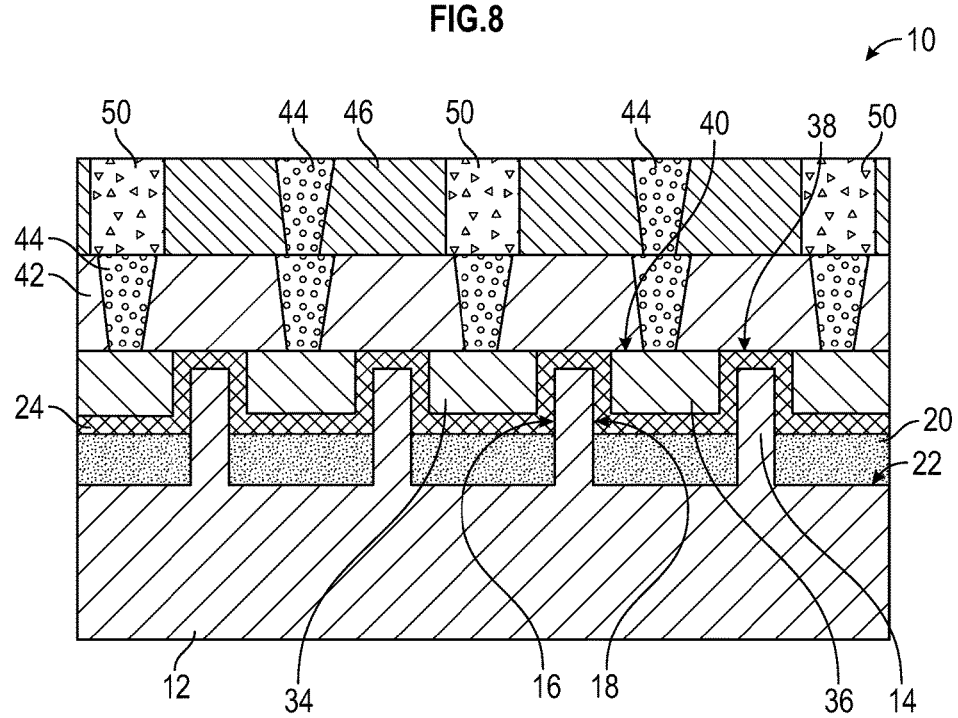

A second interlayer dielectric 46 is formed overlying the first interlayer dielectric 42, as illustrated in an embodiment in FIG. 8. One or more interconnects 50 and/or via contacts 44 may then be formed in the second interlayer dielectric 46, as illustrated in an exemplary embodiment in FIG. 9 with continuing reference to FIG. 8. The interconnect 50 is formed from electrically conductive materials, such as copper, and may use a damascene or dual damascene process. In an exemplary embodiment, the interconnect 50 includes an interconnect seed layer and an interconnect core (not individually illustrated.) The interconnect seed layer may improve adhesion of the core to dielectric materials, which can improve reliability. The interconnect seed layer may be formed of copper and manganese deposited by physical vapor deposition using copper amidinate and manganese amidinate. The interconnect core may then be deposited, where the interconnect core is deposited by copper electroplating followed by chemical mechanical planarization to remove the overburden.

Figure 10:
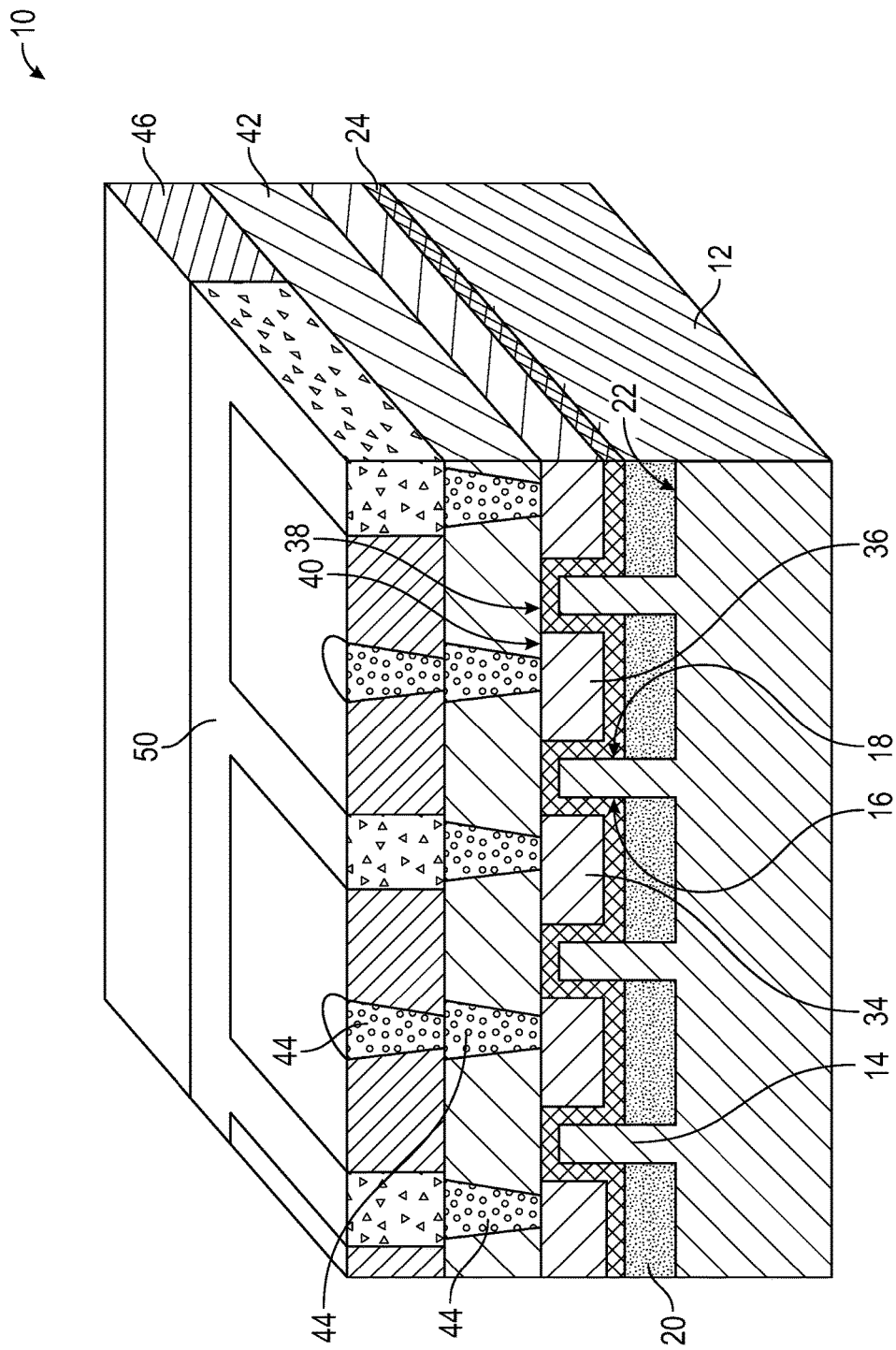
FIG. 10 is a sectioned perspective view of an embodiment of an integrated circuit and methods of producing the same.

FIG. 10 illustrates a perspective sectional view of a portion of the integrated circuit 10. Additional interlayer dielectrics, via contacts 44, and interconnects 50 may be formed in a wide variety of manners, where the via contacts 44 and the interconnects 50 are formed such that each of the first control gates 34 are in electrical communication with each other, and each of the second control gates 36 are in electrical communication with each other, but the first control gates 34 remain electrically isolated from the second control gates 36. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators.

Figure 11:
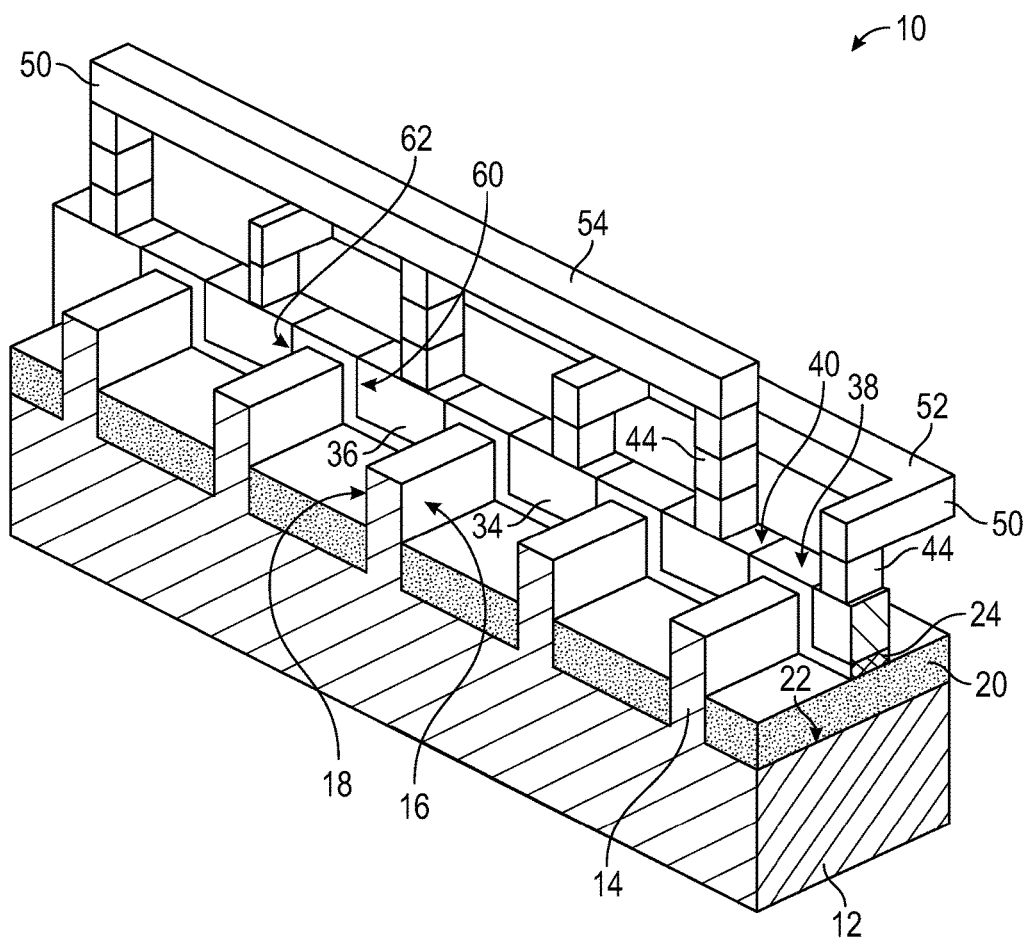
FIG. 11 is a sectioned perspective view of an embodiment of an integrated circuit and methods of producing the same, where interlayer dielectric material is removed from drawings to better illustrate the remaining components.

Referring to FIG. 11, one embodiment of a portion of the integrated circuit 10 is shown in a sectioned perspective view where the interlayer dielectrics are removed to more clearly illustrate the memory cells. A first control line 52 is an interconnect 50 that is in electrical communication with the first control gates 34, and a second control line 54 is a different interconnect 50 that is in electrical communication with the second control gates 36. The first and second control lines 52, 54 are electrically isolated from each other, so the first and second control gates 34, 36 are not in electrical communication with each other through the first or second control lines 52, 54. The first and second control lines 52, 54 may be formed within the same or different interlayer dielectrics, so the first and second control lines 52, 54 may be at different heights above the fins 14 and other components (as illustrated). Either of the first and second control lines 52, 54 may be formed to the side of the first and second control gates 34, 36, as illustrated for the first control line 52, where a portion of the first control line 52 does not directly overlie the first and second control gates 34, 36 and the memory cell layer 24. The memory cell layer 24 and the first and second control gates 34, 36 may be positioned over only the indicated portion of the fins 14 using lithography and selective etching.

A memory cell includes a fin 14, the memory cell layer 24, and the adjacent control gate, as well as other components. Each fin 14 is part of 2 memory cells (i.e., a two-bit memory cell.) The exemplary two-bit memory cell includes: (1) a first memory cell 60 that includes the fin 14, the memory cell layer 24 adjacent to the first fin sidewall 16, and the first control gate 34, and (2) a second memory cell 62 that is separate from the first memory cell 60. The second memory cell 62 includes the same fin 14 as the first memory cell 60, a different portion of the same the memory cell layer 24 as the first memory cell 60, where the portion of the memory cell layer 24 for the second memory cell 62 is adjacent to the second fin sidewall 18, and the second control gate 36. As such, the first and second memory cells 60, 62 share a common fin 14 and a common memory cell layer 24, where the memory cell layer 24 is continuous (i.e., unbroken) between the first and second memory cells 60, 62. The insulating nature of the memory cell layer 24 allows for a continuous memory cell layer 24 between different memory cells without interference in the separate operation of the different first and second memory cells 60, 62.

Figure 12:
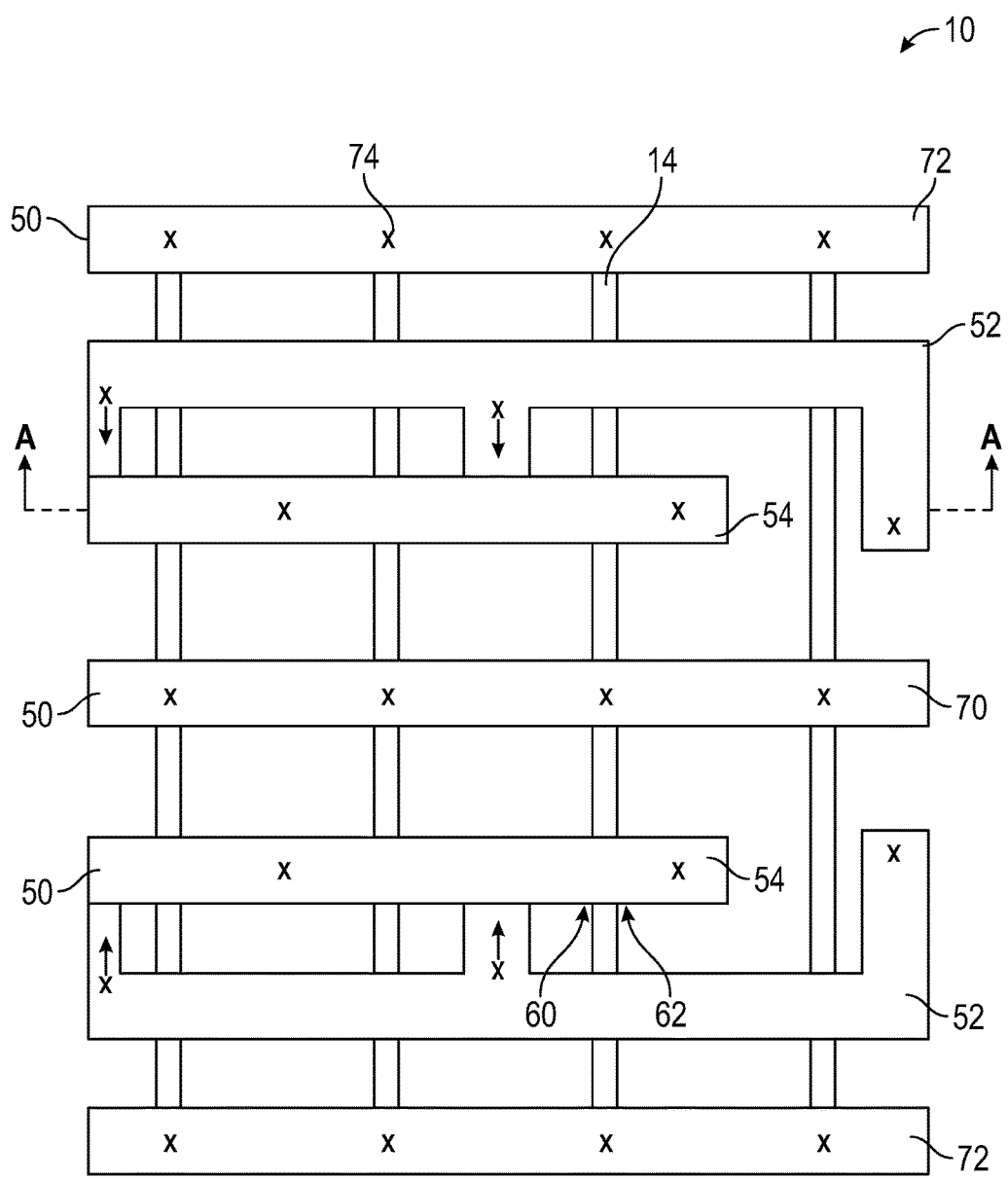
FIG. 12 is a plan view of an integrated circuit and methods of producing the same in accordance with exemplary embodiments.

FIG. 12 is a top view of an embodiment of a portion of the integrated circuit 10 illustrating the fins 14, some interconnects 50, and "x" symbols 74 that illustrate where a via contact forms an electrical connection with the interconnect 50 and the underlying component. Continuing reference is made to the same embodiment as illustrated in FIG. 11. The line A-A illustrates the cross section illustrated in FIGS. 1-9. The interconnects 50 are individually labelled and named as follows: (A) the first control line 52 that is in electrical communication with the first control gates 34; (B) the second control line 54 is in electrical communication with the second control gates 36; (C) a source line 70 that is in electrical communication with the fins 14 at a source side of the memory cell; and (D) a drain line 72 that is in electrical communication with the fins 14 at a drain side of the memory cell. The source and drain lines 70, 72 may be formed as described above for other interconnects 50, and the electrical connections may be formed as described above for the via contacts 44.

The heights of the control gate top surfaces 40 and the memory cell top surface 38 are about the same as a height of the fins 14, with the difference being about a thickness of the memory cell layer (not individually illustrated). This relatively small difference in height can match the height of FinFETS formed in a logic area (not illustrated) of the integrated circuit 10, which can help control the manufacturing cost for the integrated circuit 10. The formation of a first and second memory cell 60, 62 on a common fin can increase the total capacity of a memory bank with a fixed size. In addition, the first and second control gates 34, 36 can be formed without gaps because of the relatively low aspect ratio between the fins.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate;
   adjacent fins extending from the substrate, where each of the adjacent fins comprises a first fin sidewall and a second fin sidewall;
   a memory cell layer adjacent to the first fin sidewall and the second fin sidewall of each of the adjacent fins, wherein the memory cell layer comprises a memory cell layer top surface, wherein the memory cell layer comprises a base insulator layer, an electron trap layer, and a cover layer, and wherein the base insulator layer overlies the adjacent fins, the electron trap layer overlies the adjacent fins, and the cover layer overlies the adjacent fins;
   a first control gate adjacent to the memory cell layer, wherein the first control gate comprises a control gate top surface, wherein the memory cell layer is positioned between the first fin sidewall of each of the adjacent fins and the first control gate, wherein one first control gate fills the position between portions of the memory cell layer that are adjacent to first fin sidewalls of the adjacent fins such that the control gate top surface is co-planar with the memory cell layer top surface for an entire distance between the adjacent fins; and
   a second control gate adjacent to the memory cell layer, wherein the memory cell layer is positioned between the second fin sidewall of at least one of the adjacent fins and the second control gate, and wherein the second control gate is electrically isolated from the first control gate.

2. The integrated circuit of claim 1 wherein:
   the base insulator layer comprises silicon dioxide;
   the electron trap layer comprises silicon nitride; and
   the cover insulator layer comprises silicon dioxide.

3. The integrated circuit of claim 2 wherein:
   the base insulator layer is positioned between the adjacent fins and the electron trap layer; and
   the electron trap layer is positioned between the base insulator layer and the cover insulator layer.

4. The integrated circuit of claim 1 further comprising:
   a fin insulator underlying the memory cell layer, wherein the fin insulator further underlies the first control gate.

5. The integrated circuit of claim 1 further comprising:
   a first control line in electrical communication with the first control gate; and
   a second control line in electrical communication with the second control gate, wherein the first control line is electrically isolated from the second control line.

6. The integrated circuit of claim 1 further comprising:
   a source line in electrical communication with at least one of the adjacent fins.

7. The integrated circuit of claim 6 wherein the base insulator layer underlies the first control gate, the electron trap layer underlies the first control gate, and the cover layer underlies the first control gate.

8. The integrated circuit of claim 6 wherein:
   the memory cell layer underlies the first control gate; and
   the memory cell layer underlies the second control gate.

9. The integrated circuit of claim 6 wherein:
the memory cell layer is electrically insulating.

10. The integrated circuit of claim 6 wherein:
all of the control gate top surface of the first control gate is co-planar with the memory cell layer top surface.

11. An integrated circuit comprising:
a substrate;
a fin extending from the substrate;
a memory cell layer directly overlying the fin such that the memory cell layer directly contacts an upper surface of the fin, wherein the memory cell layer comprises a memory cell layer top surface;
a first memory cell, wherein the first memory cell comprises the fin, wherein the first memory cell comprises the memory cell layer, wherein the first memory cell comprises a first control gate, wherein the first control gate comprises a control gate top surface that is co-planar with the memory cell layer top surface, and wherein all of the control gate top surface is planar;
a second memory cell separate from the first memory cell, wherein the second memory cell comprises the same fin as the first memory cell, the second memory cell comprises the same memory cell layer as the first memory cell, the second memory cell comprises a second control gate that is different than the first control gate, and wherein the memory cell layer is continuous from the first memory cell to the second memory cell; and
wherein one first control gate is part of at least two different memory cells, wherein the at least two different memory cells that comprise the one first control gate comprise different fins.

12. The integrated circuit of claim 11 wherein:
the memory cell layer comprises a base insulator layer, an electron trap layer, and a cover insulator layer.

13. The integrated circuit of claim 12 wherein:
the base insulator layer comprises silicon dioxide;
the electron trap layer comprises silicon nitride; and
the cover insulator layer comprises silicon dioxide.

14. The integrated circuit of claim 11 wherein:
the fin comprises a first fin sidewall and a second fin sidewall, wherein:
the first control gate is adjacent to the fin such that the memory cell layer is positioned between the first control gate and the first fin sidewall; and
the second control gate is adjacent to the fin such that the memory cell layer is positioned between the second control gate and the second fin sidewall.

15. The integrated circuit of claim 14 further comprising:
a fin insulator adjacent to the first fin sidewall, wherein the first control gate overlies the fin insulator.

16. The integrated circuit of claim 15 wherein the memory cell layer underlies the first control gate such that the memory cell layer is positioned between the first control gate and the fin insulator.

17. The integrated circuit of claim 14 wherein:
the memory cell layer top surface is co-planar with all of the control gate top surface.

18. The integrated circuit of claim 11 wherein the memory cell layer is electrically insulating.

19. A method of producing an integrated circuit comprising:
forming a memory cell layer directly overlying adjacent fins that extend from a substrate such that the memory cell layer directly contacts a top surface of the adjacent fins, wherein the memory cell layer is also formed adjacent to a first fin sidewall and adjacent to a second fin sidewall of each of the adjacent fins, and wherein the memory cell layer comprises a base insulator layer, an electron trap layer, and a cover layer;
forming a first control gate adjacent to the memory cell layer such that the memory cell layer is between the first fin sidewall of each of the adjacent fins and the first control gate;
forming a second control gate adjacent to the memory cell layer such that the memory cell layer is between the second fin sidewall of at least one of the adjacent fins and the second control gate, and wherein the second control gate is electrically isolated from the first control gate; and
planarizing the first control gate and the second control gate such that a control gate top surface is co-planar with a memory cell layer top surface for an entire distance between the adjacent fins, and wherein one first control gate fills the position between portions of the memory cell layer that are adjacent to the first fin sidewalls of the adjacent fins.

* * * * *